(12) United States Patent
Young et al.

(10) Patent No.: US 6,912,260 B2
(45) Date of Patent: Jun. 28, 2005

(54) SYSTEM CLOCK SYNCHRONIZATION USING PHASE-LOCKED LOOP

(75) Inventors: Matthew Young, Farnborough (GB); Chris J. Goodings, Fleet (GB)

(73) Assignee: VTech Communications, Ltd., Tai Po (HK)

( * ) Notice: Subject to any disclaimer, the term of this patent is extended or adjusted under 35 U.S.C. 154(b) by 193 days.

(21) Appl. No.: 10/205,459

(22) Filed: Jul. 25, 2002

(65) Prior Publication Data

US 2002/0187798 A1 Dec. 12, 2002

Related U.S. Application Data

(63) Continuation of application No. 10/038,963, filed on Jan. 3, 2002, now abandoned.

(30) Foreign Application Priority Data

Jan. 3, 2001 (GB) ................................................ 0100094

(51) Int. Cl.⁷ ................................................. H04L 7/04
(52) U.S. Cl. ...................... 375/362; 375/376; 327/159; 327/160; 370/510; 370/512
(58) Field of Search ................................ 375/359, 360, 375/362, 365, 368, 372, 376, 375; 327/147, 150, 151, 157, 159, 160; 370/509, 510, 512

(56) References Cited

U.S. PATENT DOCUMENTS 4,706,263 A * 11/1987 von der Embse ............ 375/343
4,759,041 A 7/1988 Anderson et al.
4,941,156 A 7/1990 Stern et al.
5,007,070 A 4/1991 Chao et al.
5,274,681 A 12/1993 Yamada et al.
6,574,225 B2 * 6/2003 Reynolds et al. ...... 370/395.62
6,574,288 B1 * 6/2003 Welland et al. ............. 375/327

FOREIGN PATENT DOCUMENTS

| DE | 195 37 361 A1 | 4/1997 |
| EP | 0622918 A2 | 11/1994 |
| GB | 2 315 197 A | 1/1998 |
| JP | 2179045 A | 7/1990 |
| JP | 09-298463 | 11/1997 |
| JP | 10093540 A | 4/1998 |
| JP | 10-178458 | 6/1998 |
| JP | 110112982 A | 4/1999 |
| JP | 200-216760 A | 8/2000 |
| WO | WO 95/33320 A1 | 12/1995 |
| WO | WO 98/04063 | 1/1998 |

* cited by examiner

Primary Examiner—Dac V. Ha
(74) Attorney, Agent, or Firm—Shaw Pittman LLP

(57) ABSTRACT

An apparatus for synchronizing the system clocks of wireless devices in a digital communications system is presented. A digital phase-locked loop is employed. The phase-locked loop may include a counter which is incremented by a local device system clock and latched by a frame synchronization marker received from a remote device, whereby the counter output comprises a feed forward signal. The phase-locked loop may alternatively include a counter that reflects the level of data stored in receive and/or transmit FIFO buffers. The loop output signal controls the frequency of the system clock oscillator.

4 Claims, 2 Drawing Sheets

SYSTEM CLOCK SYNCHRONIZATION USING PHASE-LOCKED LOOP

This application is a continuation application of U.S. patent application Ser. No. 10/038,963, filed Jan. 3, 2002, now abandoned.

BACKGROUND OF THE INVENTION

1. Field of the Invention

This present invention relates in general to wireless digital communications. In particular, the invention relates to the synchronization of base and mobile station system clocks in a digital communications system such as a cordless telephone.

2. Background Art

Time Division Duplex ("TDD") frame structures are popularly used in wireless communications to transfer both receive and transmit signals over a common radio frequency channel. While TDD is used in many applications ranging from satellite systems to cellular telephone systems, it is also commonly employed in digital cordless telephone systems.

A typical digital TDD cordless telephone system might consist of a base station communicating with a handset in full-duplex mode. In such a TDD frame structure, the base station transmits data to the handset in one half of the frame and the handset replies in the other half of the frame. Specifically, as the user speaks into the receiver of the handset, the voice signals are sampled at regular intervals, encoded, compressed and transmitted in periodic bursts of data to the base station during a first portion of each TDD frame. Alternately, the handset receives bursts of data transmitted from the base station during a second portion of each TDD frame that are then decompressed, decoded and converted to an audio signal. Because the base station and handset take turns alternately transmitting and receiving data in bursts over the same channel according to the TDD frame structure, neither the handset nor the base unit receives a steady stream of data, yet the user is normally able to conduct a conversation with a second party with no breaks in the continuity of the audio communications.

To enable this continuous audio to be heard at the telephone receiver, buffers are typically used to smooth out the data bursts. In the handset, the user's compressed voice data can be collected in a First In First Out (FIFO) data buffer. The compressed samples are then emptied from the FIFO, gathered into packets and transmitted in bursts over the air during the transmit portion of the TDD frame. During the receive portion of the TDD frame, a second FIFO buffer is filled with the received data and the compressed samples are then emptied from the buffer and decompressed at regular intervals to produce a continuous audio stream to the user. An analogous operation is performed at the base station.

The operation of these buffers in both the handset and the base station is critical to providing a continuous voice communications link. If the buffers become completely filled before data is emptied and transmitted, or if the buffers empty as data is retrieved for transmission, then audio dropouts and a disruption of the seamless communications link can occur. The rate at which the buffers are filled and emptied is dependent upon the frequencies of the clocks of the base station and the handset. These clocks are often driven by a crystal oscillator (or "crystal"). The two systems each operate from their own independent crystals, and while the crystals are frequency matched in production, the frequencies of operation of the base station and handset crystals will often drift apart over time and with temperature variations. If the base station clock frequency is slightly lower than the handset clock frequency then the handset data buffer will eventually become empty because the rate at which the base unit sends audio data is less than the rate at which the handset pulls data from the buffer for decompression and audio playback. The opposite phenomenon will occur if the handset clock frequency is slightly lower than the base station clock frequency. Both scenarios will likely result in audio dropouts, causing irritation to the users of the communications system. Therefore, critical to the operation of a TDD communications link is the maintenance of equivalent clock frequencies in both the handset and the base station.

One technique that can be used to help maintain synchronization between a base and handset involves the use of bit counters operating in the base station and handset. At the beginning of each frame, the base station transmits a synchronization marker and simultaneously resets a bit counter. The handset upon detecting the synchronization marker also resets a bit counter. The base station and handset bit counters are then incremented each according to its own local clock, and each device relies on its bit counter to determine the timing within a given frame. This technique prevents small differences in the local clock from disrupting the reception of each frame of data by periodically realigning the clocks of the base station and handset.

However, even when such a synchronization marker method is implemented, over many frames of data a difference in local clock frequencies will still likely have a detrimental effect on the FIFO behavior because, while the handset frame is locked to the base station frame via the synchronization marker, the amount of data being pushed into the handset receive FIFO will differ from the amount of data being emptied out of the base station transmit FIFO. This causes the handset receive FIFO to prematurely either fill up or empty depending on whether the base station clock is faster or slower than the handset clock, and will likely over time result in an audio dropout. Thus, the bit counter method alone is not a sufficient solution.

Another technique that can be used to compensate for differing clock frequencies is to over-sample the received data. Oversampling can be employed because the different crystal frequencies act to change the sampling rate of the audio stream. Thus, when the handset and base station crystal frequencies are mismatched, the audio stream arrives at the handset at a different sample frequency than is expected by the handset based on the handset crystal frequency. One solution to this problem is to oversample the incoming audio stream and then resample it to match the local sample frequency. While this prevents breaks in the audio stream at the receiver, the re-sampling process requires significant microprocessor overhead as a large number of calculations are run at a multiple of the audio sampling rate, thus making it an undesirable solution for many applications due to factors such as increased cost, size, part count and/or power consumption.

SUMMARY OF THE INVENTION

A method and apparatus for synchronising the clock of a wireless digital receiver are disclosed. In accordance with one aspect of the invention, the receiver may include a feedback loop control circuit for controlling the clock frequency. The loop includes a counter, a loop filter, a loop gain block and a frequency-tuneable oscillator. The counter includes a count input and an output latch line. A signal derived from the receiver clock is applied to the count input. A frame synchronisation signal, derived from the received digital data, is applied to the latch line. The frequency-tuneable oscillator may include a digital-to-analog converter which receives the output of the loop gain block, and applies an analog voltage to a varactor control input. The varactor may be connected in parallel with a crystal to form a voltage-controlled oscillator, which generates the clock signal. A summing block can be implemented to allow for calibration of the baseline clock frequency through the addition of a configurable calibration value. In one sample embodiment, the summing block can be positioned between the loop filter output and the loop gain block input.

In accordance with another aspect of the invention, the feedback loop counter may be an up/down counter whose state reflects the status of a data buffer into which received data is temporarily stored. The loop operates to adjust the receiver clock frequency towards maintaining a predetermined level of data within the buffer by controlling the rate at which data is read out of the buffer.

DETAILED DESCRIPTION OF THE DRAWINGS

Figure 1:
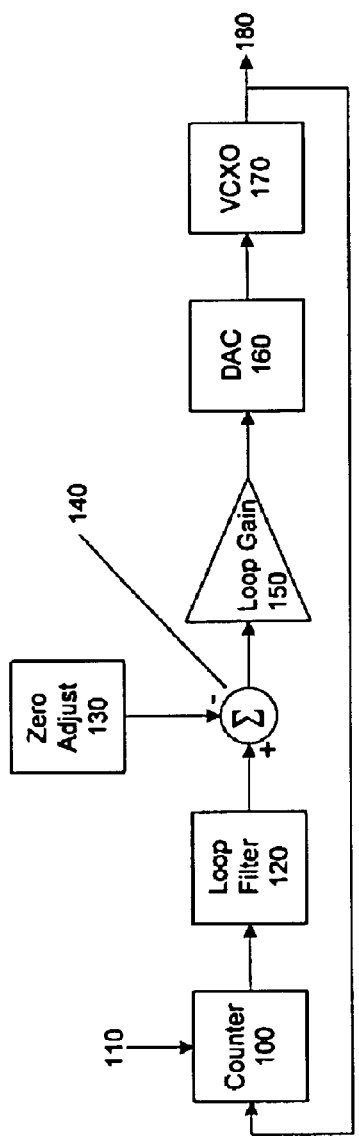
FIG. 1 is a block diagram of a first embodiment of the invention designed to synchronize the system clocks of two radio systems.

While this invention is susceptible to embodiment in many different forms, there are shown in the drawings and will be described in detail herein specific embodiments. The present disclosure is to be considered as an exemplification of the principle of the invention intended merely to explain and illustrate the invention, and is not intended to limit the invention in any way to embodiments illustrated.

FIG. 1 illustrates a Phase-Locked Loop (PLL) circuit that can be used in a wireless communications system such as a TDD system to dynamically adjust a device clock frequency to maintain synchronization with another device. The circuit is illustrated in the context of a cordless telephone system comprising a base unit and a handset, although its application is not limited to such a system. With the circuit of FIG. 1, the handset locks the handset clock frequency to the base station clock frequency. The PLL system of FIG. 1 includes: counter 100, loop filter 120, zero adjust 130, summing block 140, loop gain 150, digital to analog converter (DAC) 160 and voltage-controlled crystal oscillator (VCXO) 160.

Counter 100 is a free-running counter clocked by handset clock signal 180. Synchronization marker signal 110, transmitted by the base station at the start of each frame, provides a latch for counter 100 such that counter 100 outputs the value of the total number of handset clock cycles that occur between two subsequent base station synchronization markers. Loop filter 120 performs a running average operation upon counter 100 output values over a predetermined number of synchronization marker cycles.

Summing block 140 subtracts a stored offset value, zero adjust 130, from the averaged count value, the output of loop filter 120. The zero adjust affect provides for calibration of the relationship between the loop output signal and the system clock frequency that is determined by the loop output signal. If, for example, the zero adjust offset equals the number of handset clock cycles contained in a base station synchronization marker period when both the handset and base station clock frequencies are exactly equal, then the output of summing block 140 is directly proportional to the relative frequency difference between the handset and base station clocks. In such an embodiment, when the handset clock frequency is locked to the base station clock frequency, the output of summing block 140 is necessarily equal to zero. It may be desirable to implement a zero adjust calibration procedure that would set zero adjust offset 130 such that the handset clock frequency matches the frequency of a highly accurate reference base station clock frequency, and this calibration would likely be performed in the factory where a function generator could produce a highly stable and accurate base station synchronization marker reference signal.

The output of summing block 140 feeds loop gain 150, and then is converted to an analog control voltage by DAC 160. The magnitude of loop gain 150 accounts for the control voltage-to-frequency deviation sensitivity of VCXO 170. This control voltage acts upon VCXO 170 to change the frequency of oscillation of handset clock signal 180, which is the output of VCXO 170. In the embodiment illustrated, when the control voltage output of DAC 160 is equal to zero, VCXO 170 maintains the nominal output frequency, and when the control voltage deviates from zero the frequency of VCXO 170 deviates accordingly. It is through this mechanism that the handset clock frequency is adjusted such that is becomes equal to the base station clock frequency.

In one possible embodiment, VCXO 170 might include a varactor coupled to the VCXO input and included within a crystal oscillator circuit such that changes in the VCXO input control voltage result in a change in VCXO output frequency. The use of a DAC and varactor within the VCXO to tune the oscillator frequency represents but one possible embodiment, and other types of tuneable oscillators could also be readily implemented in place of VCXO 170, including a switched capacitor array in parallel with a crystal, or non-crystal oscillators.

The solution of FIG. 1 can be efficiently implemented as it only requires a small number of common hardware components: one counter to provide the relative phase information and a DAC plus varactor to provide the frequency tuning. The illustrated embodiment is also efficient in software as there is only a loop filter calculation (requiring only three multiply and accumulate (MAC) instructions) and one multiply for the loop gain adjustment. To further reduce the required processing overhead the calculation can be run once each time a predetermined number of frame synchronization markers has been received.

Figure 2:
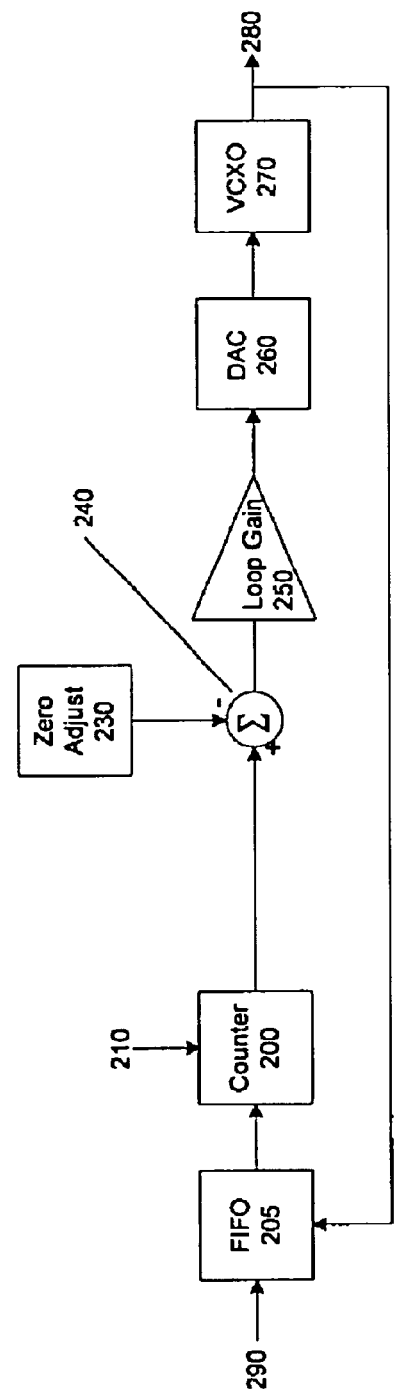
FIG. 2 is a block diagram of a second embodiment of the invention designed to synchronize the system clocks of two radio systems.

An alternative technique for phase detection using the handset audio FIFO buffer level to provide a measure of the difference in frequency between the handset and base station crystals can also be implemented, as is illustrated in FIG. 2. This method can be implemented by periodically performing a level detection to determine the number of samples stored within the FIFO buffer. For example, the measurement can be performed at a predetermined point during each frame, such that changes in the FIFO level at that point over time are detected thus measuring the slope of the FIFO level over time. The handset system clock is then adjusted to be higher or lower based upon the FIFO level slope to establish and maintain the desired FIFO level. The peak sample level within the FIFO buffer for each frame is one parameter that could be measured periodically to calculate the FIFO level slope, although the method could readily be applied to other periodic measures of the sample level within the buffer including periodic determination of the average FIFO level.

Figure 3:
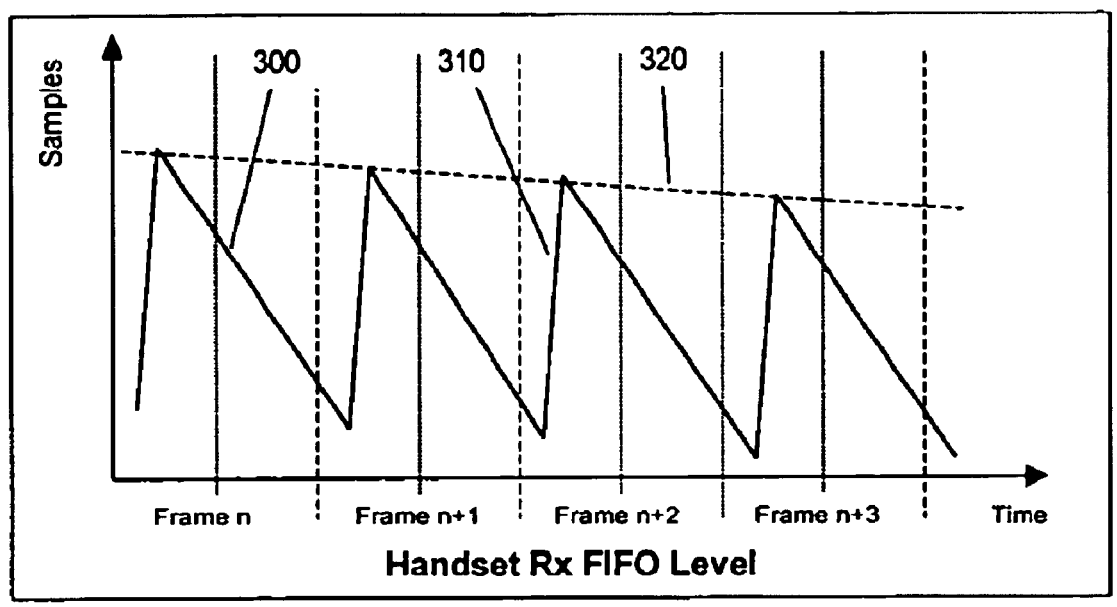
FIG. 3 is a plot depicting sample levels within a FIFO buffer as a function of time.

The plot of FIG. 3 illustrates a handset's receive FIFO buffer level as a function of time over several TDD frames when the base station and handset clock frequencies are mismatched. Specifically, FIG. 3 illustrates a situation in which the handset clock frequency is slightly higher than the base station clock frequency. The receive FIFO buffer is periodically filled with data samples as the data is received in bursts, such as during period 310, then steadily emptied as indicated generally by period 300. Because of the differing clock frequencies, the handset empties data from the FIFO buffer at a rate greater than that at which the base station transmits data to fill the FIFO buffer, such that the peak number of samples within the buffer decreases over time as indicated by the negatively-sloped line 320 that connects the peaks across each frame. By measuring the value of these peaks over a number of frames, the slope of line 320 can be determined, reflecting the direction and rate of change in the FIFO buffer level over time. The change in the FIFO level can then be used in the circuit of FIG. 2 to adjust the handset clock frequency so that the resultant FIFO buffer level converges upon a desired level, whereby the handset and base clock frequencies are synchronized. The processes can be implemented analogously for receive and transmit buffers in both the base station and handset, or the technique could be implemented in either the handset or the base station.

In the embodiment of FIG. 2, counter circuit 200 outputs the peak level of the FIFO buffer (not shown). Counter 200 is an increment/decrement counter which increments upon receiving a pulse on line 205, may be the INPUT-LOAD signal provided to the FIFO buffer. Counter 200 decrements upon receiving a pulse on line 290, which may be the TRANSFER-OUT signal provided to the FIFO buffer. The TRANSFER-OUT signal of line 290 is typically derived from the system clock signal 280, such as via the operation of frequency divider 285. Thus, counter 200 internally maintains a first state reflecting the amount of data stored within the FIFO buffer at any given time, as well as a second state reflecting the peak value of the first state. Counter 200 is latched by synchronization marker signal 210, which is received from the base station once per frame. Each time counter 200 is latched, it outputs the maximum value the counter has attained since the previous latching event, i.e. counter 200 outputs the second state and then resets it.

The output of counter 200 is passed to summing block 240, which adds zero-adjust-input 230 to set the baseline feedforward signal level that is to be ultimately applied to VCXO 270. As with zero adjust input 130, it may be desirable to calibrate input 230 with a precision reference. The output of summing block 240 is fed to loop gain 250, and passed to DAC 260. DAC 260 generates an analog voltage signal which is applied to a varactor within VCXO 270. VCXO 270 then outputs clock signal 280.

The foregoing description and drawings merely explain and illustrate the invention and the invention is not limited thereto, inasmuch as those skilled in the art, having the present disclosure before them will be able to make modifications and variations therein without departing from the scope of the invention.

What is claimed is:

1. A wireless receiver which receives digital data from a remote transmitter via a radiofrequency communications link comprised of a plurality of data frames, which wireless receiver is comprised of:

a counter with a count input that is derived from a system clock signal generated within the wireless receiver, the counter also including a latch input that is derived from a frame synchronization signal generated during each data frame;

a loop filter with an input derived from the counter output;

a loop gain block, which gain block receives an input derived from the loop filter output;

a frequency-tuneable oscillator which receives the output of the loop gain block and generates the system clock signal, the frequency of the system clock signal being dependent upon the loop gain block output;

wherein the loop gain block output is proportional to a difference between the output of the loop filter and a configurable calibration value, whereby the frequency of the system clock signal is synchronized with the remote transmitter.

2. The wireless receiver of claim 1, in which the loop gain block input is comprised of an output of a summing block, the summing block having a first input derived from the loop filter output and a second input which receives the configurable calibration value.

3. The wireless receiver of claim 1, in which the frequency-tuneable oscillator is comprised of:

a digital-to-analog converter which receives a digital input signal derived from the output of the loop gain block and generates an analog control signal; and a voltage-controlled crystal oscillator which receives the analog control signal and outputs the system clock signal, where the frequency of the system clock signal is dependent upon the analog control signal.

4. The wireless receiver of claim 3, in which the voltage-controlled crystal oscillator is comprised of:

a varactor which receives the analog control signal as its tuning input; and a crystal connected in parallel with the varactor.

* * * * *